United States Patent [19]
Kushibiki et al.

[11] Patent Number: 5,101,420
[45] Date of Patent: Mar. 31, 1992

[54] X-RAY MASK SUPPORT AND PROCESS FOR PREPARATION THEREOF

[75] Inventors: Nobuo Kushibiki, Yamato; Hideo Kato, Yokohama; Akira Miyake, Atsugi; Yasuaki Fukuda, Hatano, all of Japan

[73] Assignee: Canon Kabushiki Kaisha, Tokyo, Japan

[21] Appl. No.: 689,092

[22] Filed: Apr. 22, 1991

Related U.S. Application Data

[63] Continuation of Ser. No. 590,520, Sep. 28, 1990, abandoned, which is a continuation of Ser. No. 250,099, Sep. 28, 1988, abandoned.

[30] Foreign Application Priority Data

| Sep. 30, 1987 | [JP] | Japan | 62-244201 |
| Sep. 30, 1987 | [JP] | Japan | 62-244202 |
| Sep. 30, 1987 | [JP] | Japan | 62-244203 |
| Oct. 14, 1987 | [JP] | Japan | 62-257304 |
| Oct. 26, 1987 | [JP] | Japan | 62-268044 |
| Jan. 26, 1988 | [JP] | Japan | 63-013487 |

[51] Int. Cl.$^5$ ............................................. G21K 5/00
[52] U.S. Cl. ........................................ 378/35; 430/5
[58] Field of Search ...................... 378/34, 35; 430/5

[56] References Cited

U.S. PATENT DOCUMENTS

| 3,873,824 | 3/1975 | Bean et al. | 250/505 |
| 4,599,737 | 7/1986 | Kimura et al. | 378/35 |
| 4,604,292 | 8/1986 | Evens et al. | 427/39 |
| 4,608,326 | 8/1986 | Neubermans et al. | 378/35 |
| 4,780,382 | 10/1988 | Stengle et al. | 378/35 |
| 4,855,197 | 8/1989 | Zapha et al. | 378/35 |

OTHER PUBLICATIONS

Patent Abstracts of Japan, Kokai No. 57-092830, vol. 6, No. 176, Sep. 10, 1982.
Patent Abstracts of Japan, Kokai No. 59-202530, vol. 8, No. 49, Mar. 6, 1984.
Suzuki et al., "High Flatness Mask for Step and Repeat X-Ray Lithography", J. Vac. Sci. Technol. B4(1), Jan.-/Feb. 1986, pp. 221 through 225.
Madouri et al., "Non Hydrogenated Materials for X-Ray Masks", Microelectronic Engineering 12/1987, pp. 241 through 245.

*Primary Examiner*—Craig E. Church
*Attorney, Agent, or Firm*—Fitzpatrick, Cella, Harper & Scinto

[57] ABSTRACT

An X-ray mask support comprises a support frame and a support film, wherein both of the support frame and the support film have a thermal expansion coefficient of not more than $1 \times 10^{-5} K^{-1}$ or wherein the thermal expansion coefficient of the support film does not exceed that of the support flame or wherein both the support frame and the support film have a thermal expansion coefficient of not more than $1 \times 10^{-5} K^{-1}$ and the support film has a surface roughness at least on the mask surface, of not more than 10 nm r.m.s. Basically a process for preparing the X-ray support film comprises the steps of forming a film on a substrate and sintering the film.

81 Claims, 3 Drawing Sheets

X-RAY MASK SUPPORT AND PROCESS FOR PREPARATION THEREOF

This application is a continuation of prior application, Ser. No. 07/590,520 filed Sept. 28, 1990, which application is a continuation of prior application, Ser. No. 07/250,099 filed Sept. 28, 1988, both now abandoned.

BACKGROUND OF THE INVENTION

1. Field of the Invention

The present invention relates to a support for a mask used in X-ray lithography processing for preparing integrated circuits, and a process for preparing the support.

2. Related Background Art

Recent semiconductor integrated circuits are demanded to be made small in size and made highly integrated, and a method of forming finer patterns is required in the preparation process therefor. Accordingly, it has become popular to utilize the techniques of X-ray lithography.

In general, a mask used in X-ray lithography processing comprises a support frame having the shape of a ring or the like and a film member having X-ray transmitting portions and X-ray non-transmitting portions. The film member covers the opening of the support frame. In usual cases, the X-ray non-transmitting portions are formed of an X-ray opaque or absorbing material having a geometrical pattern and provided on a mask support film (membrane) that constitute a base for the film member, and the X-ray transmitting portions are formed of the mask support film itself corresponding to the part on which the X-ray opaque or absorbing material is not provided.

The X-ray opaque or absorbing material must be formed on the mask support film with a submicroscopic size, with a good precision and with good reproducibility, and also the mask support film is required to have dimensional stability. The mask support film, which covers the support frame with a considerable tension, is also required to have mechanical strength.

Since it is required to transfer mask patterns to a semiconductor wafer with a submicroscopic size and precision without causing any deformation even by heat due to the absorption of the incidence of X-rays, a mask support film comprising a ceramic material has been proposed so that the above requirements can be fulfilled.

The support film comprising a ceramic material is prepared by forming a film on a substrate by a gaseous phase method such as physical vapor deposition (PVD), chemical vapor deposition (CVD) and molecular beam deposition (MB), followed by removal of the substrate.

Preparation of the mask support film comprising SiC, which is a preferred ceramic in view of the mechanical strength or less thermal deformation, is carried out according to a gaseous phase film deposition method typified by the method described in Japanese Patent Publication No. 53-24785, in which a reactive ion-plating method is employed to produce an SiC film on a silicon substrate in an atmosphere of a hydrocarbon having 1 or 2 carbon atoms.

However, such a preparation method according to the gaseous phase film deposition has a difficulty in mass production, resulting in expensiveness. Because a gaseous phase film deposition apparatus is very expensive, the number of the films that can be formed at one time is limited, and the film deposition rate is not high. Besides, it has been not suitable to mass production also for the following reasons:

(a) Since the properties of films to be formed depend on various parameters such as substrate temperature, gas concentration and gas purity which are dependent on each other, conditions for film deposition must be set with complicacy and also maintained with difficulty.

(b) The operation to remove the substrate by etching or the like after film deposition is essential, and such an operation is cumbersome.

There is also the problem that a film having irregularities the same as an order of its thickness is formed because, in the mask support film formed by the gaseous phase film deposition method, crystals that grow from various points on the substrate collide with each other and the axis or lattice plane of the crystals appear almost randomly.

The irregularities on the surface of the support film bring about the following undesirable results.

(1) Because of the crystal particle diameter that comes to be from $\sim 1$ $\mu m$ to several $\mu m$, the visible light or near infrared light used for alignment undergoes such large scattering that the transmittance may be lowered and the S/N ratio of the alignment light signal may be lowered.

(2) Since the irregularities indicate a thickness non-uniformity, they may cause non-uniformity in the intensity of transmitting X-rays.

(3) Because of lack of smoothness of the surface, there may be caused deterioration of precision, non-uniformity in the thickness of X-ray opaque or absorbing materials, and adhesion failure of X-ray opaque or absorbing material patterns, when fine patterns are formed.

Moreover, the film is so thin and so hard that it can only be flattened with difficulty. Thus, the mask support film having surface roughness is not suitable to the formation of X-ray opaque or absorbing materials with good precision, and the mask support film formed by the gaseous phase method has not necessarily had satisfactory performances. In addition, an adhesive is always used to fix the above ceramic film to a support member, but adhesives for practical use are organic polymers. Accordingly, even when a heat-resistant adhesive such as polyimide is used, the tension applied to the film is loosened to make it difficult to retain the submicron patterns, because of the large thermal expansion coefficient (about 100 times the ceramics) of such heat-resistant adhesive.

SUMMARY OF THE INVENTION

The present invention has been made to solve such problems, and a principal object thereof is to provide an X-ray mask support film having good performances, that can suppress strains produced by irradiation with X-rays to zero or to a level as minimum as possible, may not cause the lowering of S/N ratio of the alignment light signal, and may not cause not only the non-uniformity in the intensity of transmitting X-rays or non-uniformity in the thickness of X-ray opaque or absorbing material, but also the adhesion failure of the X-ray opaque or absorbing material patterns.

The present invention provides an X-ray mask support comprising a support frame and a support film, wherein the support frame and support film have both a thermal expansion coefficient of not more than $1 \times 10^{-5} K^{-1}$.

In another embodiment, the present invention provides an X-ray mask support comprising a support frame and a support film, wherein the thermal expansion coefficient of said support film does not exceed the thermal expansion coefficient of said support frame.

In still another embodiment, the present invention provides an X-ray mask support comprising a support frame and a support film, wherein said support frame and said support film have both a thermal expansion coefficient of not more than $1 \times 10^{-5} K^{-1}$ and said support film has a surface roughness at least on the mask surface, of not more than 10 nm r.m.s.

The present invention also provides a process for preparing an X-ray mask support film, comprising the steps of forming a film on a substrate, and sintering said film.

In a further embodiment of the process, the present invention provides a process for preparing an X-ray mask support film, comprising the steps of forming a film on a substrate comprising a compound having the same constituent as that of a sintered product of said film, and sintering said film.

Other embodiments of the process will become apparent from the following description.

DETAILED DESCRIPTION OF THE PREFERRED EMBODIMENTS

The X-ray mask support film of the present invention comprises a support frame and a support film, and is characterized in that both the support frame and support film comprise a material having a thermal expansion coefficient of not more than $1 \times 10^{-5} K^{-1}$ or a material such that the thermal expansion coefficient of said support film does not exceed the thermal expansion coefficient of said support frame.

The present invention will be described below in detail.

In the present invention, the material that has a thermal expansion coefficient of not more than $1 \times 10^{-1}$ and a Young's modulus of not less than 10 GPa may typically include ceramics. They include, for example, ceramics such as silicon nitride, silicon carbide, sialon (Si, Al, O, N) in which part of the silicon of silicon nitride has been substituted with aluminum and part of the nitrogen thereof has been substituted with oxygen, and carbon or graphite. Of the above materials, particularly preferably used in the present invention are silicon nitride and silicon carbide.

The feature that the thermal expansion coefficient is not more than $1 \times 10^{-5} K^{-1}$ requires that, assuming a mask pattern on a support member to be 1 cm, the elongation caused by a temperature change of 1° C. is not more than $10^{-7}$. To retain the submicron patterns, the thermal expansion coefficient must be not more than $1 \times 10^{-5} K^{-1}$.

The feature that the thermal expansion coefficient of the support film is smaller than that of the support frame is advantageous for retaining the state that the film is stretched, since the frame undergoes a larger thermal expansion than the film when exposed to heat.

The above ceramics have differences in particle diameter, particle size distribution, or crystal form including three types of a cubic system ($\beta$), a hexagonal system ($\alpha$) and amorphous in case of Silicon carbide, and also three types of a hexagonal system ($\alpha$), trigonal ($\beta$) and amorphous in the case of silicon nitride. These structural differences result in differences in values of physical properties, based on differences in preparation methods. Accordingly, the thermal expansion coefficient of the support frame can be readily set so as not to exceed that of the support film.

In the case of carbon or graphite, when it is obtained by sintering a pitch, the above setting can be easily carried out by controlling the degree of graphite formation and the layer structure.

The film is subjected to a constant stress to maintain the flatness, where its elongation must be very small, and hence the film is required to be stretched with a tension of from 10 to 100 MPa. What is required in the submicron processing is to withstand the stress to give no elongation, and this is preferred for the reason that the dimensional precision can be retained. It is also preferred for the support film to have a thermal conductivity of not less than 4 W/m·K, for the reason that the local distortion produced by the temperature rise caused by irradiation with X-rays can be suppressed owing to heat conduction.

In the present invention, an organosilicon polymer may be used. The organosilicon polymer includes, for example, a polymer generically termed as polysilane represented by the general formula:

wherein R' is methyl; R" is methyl, ethyl, cyclohexyl, phenyl, phenetyl, or tolyl; and n is not less than 100, more preferably not less than 200.

It may specifically include poly(dimethylsilane-methylphenylsilane), poly((dimethylsilane-methylcyclohexylsilane) and poly(methylphenetylsilane-methylphenethylsilane). Readily available is poly(dimethylsilane-methylphenylsilane).

Another example of the organosilicon polymer is a polymer generically termed as polysilazane represented by the general formula:

wherein R is hydrogen, $C_1$ to $C_8$ alkyl, or aryl such as phenyl, benzyl or phenetyl, n is not less than 100, preferably not less than 200.

It specifically includes poly(methylsilazane), poly(ethylsilazane) and poly(phenylsilazane).

In the case of carbon, petroleum pitch commonly used in formation of carbon fiber may be molded according to a molding method such as press molding, injection molding or cast molding in a mold previously prepared, since it has melt properties similar to organic polymers.

Of the materials described above, preferably used in the present invention are particularly polysilane and polysilazane. Employment of these materials as described above and the preparation method as described below makes it possible to well satisfy the preferable conditions as required herein.

Hitherto, well known methods of preparing silicon carbide include a method in which silica is carbonized by reduction using carbon, and a method in which metal silicon, silicon monoxide or silicon dioxide is reacted with carbon. In the case of silicon nitride, known are methods which are direct-nitriding of metal silicon, silica reduction, imide nitride thermal decomposition, etc.

The above polymers have recently been found, which are polymers for use in silicon carbide or silicon nitride, comprising silicon as a polymer backbone and called ceramics precursor polymers to which usual molding methods for thermoplastic resins can be applied, and have been used in preparation of ceramics. Also, in the case of carbon, carbon materials synthesized from petroleum pitch have become available on the market.

Typical processes for preparing the mask support frame of the present invention include the following (1), (2) and (3).

PROCESS (1)

Figure 1:
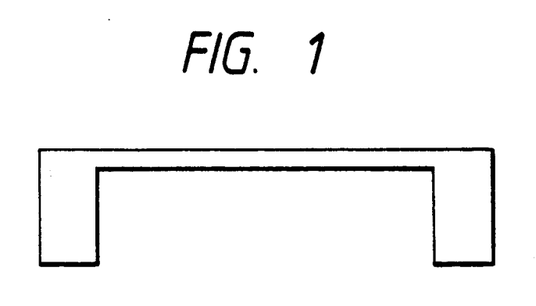
FIG. 1 and FIG. 2 are a view illustrating an integrally formed body comprising a support frame and a support film.

Polysilane, polysilazane or petroleum pitch is molded by a usual thermoplastic resin molding method (such as compression or injection) at temperatures higher than its melting point, using a mold capable of intergrally molding the support frame and support film (FIG. 1).

Figure 2:
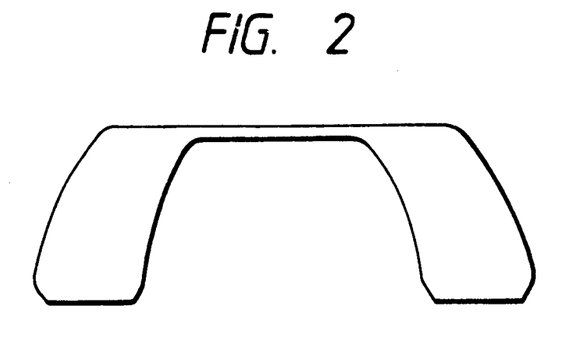

It is preferred to bring a molded product to have no edge as shown in FIG. 2, thereby making it possible to effect mold release with ease.

Next, the resulting molded product is sintered in an inert gas atmosphere to make an X-ray mask support. Typical conditions for the sintering are as follows: In the instance where the material comprises polysilane, the sintering may be carried out at temperatures raised up to 1,400° C. in one stage, or preferably used is the two-stage sintering such that the sintering is carried out at 400° to 600° C. for a given time and thereafter, the temperature is raised to carry out the sintering at 1,100° to 1,400° C. for a given time.

In the instance where the material comprises polysilazane, the sintering may be carried out according to the two-stage sintering such that the temperature is raised up to 500° C., which is maintained for several to several tens of hours, and then raised to 1,000° C.

Such sintering brings polysilane finally into an SiC sinter from SiC-SiH$_2$; and petroleum pitch is brought into graphite.

Even if no complete SiC formation, SiN formation or carbon formation is effected, in other words, even if SiC-SiH$_2$ or the like remains, the previously described properties, required for the X-ray mask support film of the present invention, can be sufficiently exhibited.

PROCESS (2)

The support frame alone is first prepared by molding and sintering. There can be utilized known methods of sinter-molding of SiC, SiN or carbon. Methods of preparing silicon carbide include a method in which silica is carbonized by reduction using carbon, and a method in which metal silicon, silicon monoxide or silicon dioxide is reacted with carbon. In the case of silicon nitride, known are methods which are direct-nitriding of metal silicon, reduction of silica, and thermal decomposition of imide nitride, etc. In the case of carbon, known is a method in which petroleum pitch is fomed into graphite by sintering.

Next, a thin film (support film) comprising the organosilicon polymer is formed on a substrate. For that purpose, for example, the organosilicon polymer may be dissolved in a solvent, and the resulting solution may be coated on the substrate by use of a coating method such as dipping, casting or spin coating, optionally followed by drying.

The solvent to dissolve the organosilicon polymer may typically include aromatic hydrocarbons such as benzene and toluene, saturated hydrocarbons such as hexane and octane, halogen derivatives, and cyclic ethers such as tetrahydrofuran.

Suitable values of concentration of the organosilicon polymer solution used for the purpose of coating the polymer may vary depending on the conditions for film formation, but may be selected from the range of from 3% by weight to 60% by weight.

In forming the thin film on the substrate, employment of the soulution used as described above may be replaced with employment of a melt of the organosilicon polymer or the like.

More specifically, the organosilicon polymer can be synthesized usually so as to have a molecular weight of from several thousand to about 1,000,000, and its melting point falls within the range of from 70° to 200° C. depending on its average molecular weight. Accordingly, the above film formation can be carried out by melting the organosilicon polymer (for example, at a temperature several tens of degrees higher than its melting point), followed by a commonly available polymer film formation method such as pressing, laminating or T-die extrusion.

In the case of carbon, the same method as in the case of the polymer may be employed to form a film on a suitable substrate by dissolving pitch in a suitable diluent as exemplified by quinoline so that the viscosity of pitch may fall within the range of from 10° to 10,000 cp, or heating the pitch.

In any film formation method of the above, the thin film formation is required to be made so that the thin film formed may have a uniform thickness over the whole.

On the thin film formed in the above manner and comprising the organosilicon polymer or pitch, a support frame previously prepared may be placed, and they may be sintered under the conditions as explained below, so that an X-ray surrport having sufficiently satisfied the properties previously mentioned can be obtained. The support film may preferably have a film thickness of from 1 to 5 μm, particularly preferably from 2 to 4 μm, in view of the strength and X-ray transmission.

In the above thin film comprising the organosilicon polymer or pitch, a known sintering aid may also be added in a trace amount (not more than 2 or 3%). The sintering aid includes, for example, Al$_2$O$_3$, BN and BeO.

In the above film of the organosilicon polymer or pitch, fibers and/or fine particles of ceramics or carbon may be contained, there by making it easy to make crystal control since the fibers or fine particles serve as crystal nuclei at the time of sintering, so that a film having much better tensile strength or impact strength can be obtained and the sintering time can also be shortened. Further, in view of the X-ray transmitting properties of the support film, it is preferred that ceramics are used.

Regarding the ceramics used in the above embodiment, there may be used ceramics whose main component unit comprises silicon carbide in the instance when a silicon carbide polymer such as polysilane is used as the organosilicon polymer, and there may be used ceramics whose main component unit comprises silicon nitride in the instance when a silicon nitride polymer such as polysilazane is used. Alternatively, there may be used sialon in which part of silicon in silicon nitride has been substituted with aluminum. An additive may also be added to these ceramics. Such an additive may include, for example, a sintering aid, boron nitride, alumina and yttrium oxide.

As to the size of the ceramics, the fineness of the ceramic fibers and particle diameter of the ceramic fine particles may preferably be 3 μm or less since the preferred thickness of the X-ray support film is 3 μm or less. Further, the fineness of the ceramic fibers may more preferably be in the range of from 0.05 to 1.5 μm. With regard to the particle diameter of the ceramic fine particles, there is no particular limitation in the lower limit for a preferred range so long as it is not more than 0.3 μm. The particle size distribution thereof may also be broad without any disadvantage.

Formed is a film containing the above described organosilicon polymer and ceramics in a suitable proportion. The proportion may be selected to find a suitable value depending on the type and molecular weight of the silicon polymer and on, when a solvent is mixed in the polymer, the type of the solvent, the type of ceramics, and so forth.

There is no limitation in the film formation method so long as the film can be formed to have a desired structure so that the film having been subjected to sintering may exhibit good properties as the X-ray mask support film, but usable is, for example, a method comprising laying up the ceramic fibers and/or fine particles on a substrate, impregnating the resulting layup with the organosilicon polymer to have the desired composition, and forming the layup into a film.

Methods for laying-up may include, for example, a method in which the ceramic fibers and/or fine particles are laid up by allowing them to fall in the air, a method in which they are laid up by allowing them to settle in a liquid, a method in which they are allowed to float in a liquid and a layup layer is obtained by a papermaking method, and a method in which a ceramic nonwoven fabric or woven fabric is merely used as the above layup. Also, the laying-up may preferably be carried out by wetting the ceramic fibers and/or fine particles with a low-melting organic solvent, thereby preventing them from being electrically charged, so that the layup can be obtained in a good state.

Methods of impregnating the layup obtained according to such methods with the organosilicon polymer may include a method in which the layup is merely impregnated with a solution or melt of the above organosilicon polymer, and a method in which the surface of the layup is covered with solid powder of the organosilicon polymer and then the surface is pressed and heated, thus impregnating the former with the latter.

Also, part of the above thin film of the organosilicon polymer may be previously formed of a silicon carbide material, so that the X-ray mask support film comprises a silicon carbide film having a surface roughness of 10 mn r.m.s. or less.

More specifically, silicon carbide is first formed into a film on a substrate typified by a silicon wafer. For this purpose, a process can be utilized, for example. In ths instance, SiH$_4$ and CH$_4$ are used as raw material gases, and the substrate is heated to temperatures of from about 600° to 800° C. The CVD process carried out under such conditions brings about polycrystalline silicon carbide, thus obtaining a film having a high modulus of elasticity. The film thickness may desirably be selected so as to be from about 1 to 3 μm so that X-rays can be sufficiently transmitted.

The silicon carbide film thus formed has a surface roughness of about 0.5 μm.

The substrate having the above SiC film may be prepared, not only by the CVD process, but also by other processes such as gaseous phase formation or sintering of fine particles.

On the silicon carbide film formed on the substrate according to the above method, the thin film comprising the organosilicon polymer may be formed according to the method previously described, so that the organosilicon polymer film whose part has been formed of silicon carbide or silicon nitride can be formed on the substrate.

Here, when there is no particular limitation in materials for the substrate used in the present invention, and substrates made of various materials can be used, so long as the substrate can meet the conditions such that, when it is a substrate to be removed before the sintering step as described below and when the substrate peeling method as describe below is employed as the method for removing it, it exhibits a peel readiness in such a degree that th substrate and the film can be separated in a good state, and, when a solvent is mixed in the organosilicon polymer at the time of coating, it has sufficient solvent resistance to that solvent.

Usable methods of peeling from a substrate, the film formed on the substrate, include a method in which it is mechanically peeled, a method in which it is mechanically peeled by sticking a pressure-sensitive adhesive, a bonding adhesive or the like, a method in which it is peeled by immersing it in a solvent insoluble or poorly soluble to the organosilicon polymer, as exemplified by water and alcohol, and a method in which the substrate is removed by dissolution when the substrate is soluble to a solvent that may not act on the organosilicon polymer. Examples of the method in which the substrate is removed by dissolution include a method in which a PVA film or an NaCl sheet is used as the substrate and the substrate is removed by dissolution using water, etc., and a method in which a polymethyl methacrylate sheet is used as the substrate and is similary removed by dissolution using acetone or the like.

The organosilicon polymer of the present invention is known to undergo cross-linking when irradiatd with light having a wavelength shorter than 350 nm (Lactualite Chimique, page 64, 1986, R. West). Accordingly, in instances in which light-irradiation is effected upon forming the film of the organosilicon polymer, there may be conducted irradiation with light having a wavelength region corresponding thereto, or light having a wavelength region of at least from 300 to 350 nm. Specifically, it is possible to use a high-pressure mercury lamp, an ultra-high-pressure mercury lamp, a xenon lamp, etc. The radiation heat that generates at the time of the above light-irradiation in the present invention may not particularly be removed.

In instances in which the sintering described below is applied to a film brought to have its own form without the use of a substrate as in the present invention or, at the time of peeling, the peeling can not be well carried out because of lack of strength of the film, a preferred method is to improve the film strength by applying light-irradiation and thereafter carrying out peeling. Embodiments of typical methods for the light-irradiation for that purpose will be discribed below with reference to the drawings.

Figure 3:
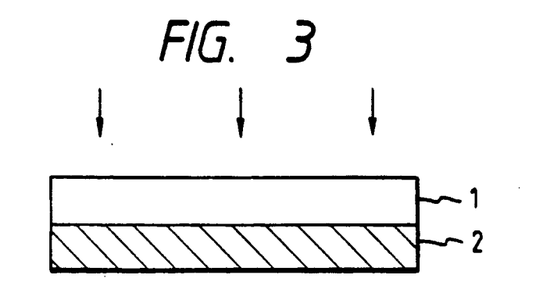
FIG. 3 to FIG. 5 are cross-sectional views exemplifying various embodiments of light-irradiation methods in the present invention.

FIG. 3 is a cross section illustrating an embodiment of the light-irradiation methods in the present invention. This embodiment is concerned with a method in which uniform light-irradiation is applied to the whole surface of an organosilicon polymer 1 from the upper part of the polymer laminated or coated on a substrate 2. Employment of this embodiment makes it possible to use as the substrate, various substrates such as a light-reflective substrate, light-transmissive substrate and light-absorptive substrate so long as they have sufficient peel readiness and solvent resistance as previously mentioned.

Figure 4:
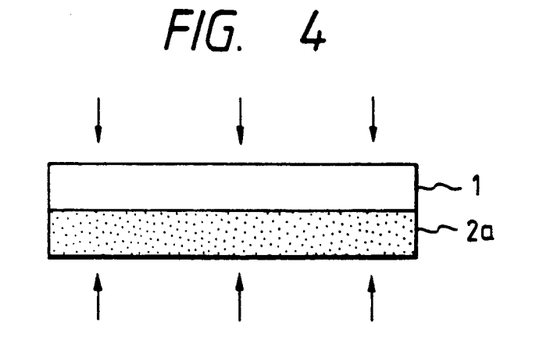

FIG. 4 is a cross section illustrating another embodiment of the light-irradiation in the present invention. Used as the substrate in this embodiment is a light-transmissive substrate 2a that does not absorb light having wavelengths shorter than 350 nm, and simultaneous irradiation of light on both the surfaces of the organosilicon polymer 1 enables more uniform cross-linking of the whole polymer 1. The light-transmissive substrate 2a used in this embodiment may specifically include glass having no absorption band at a wavelength region of 290 nm or more.

Figure 5:
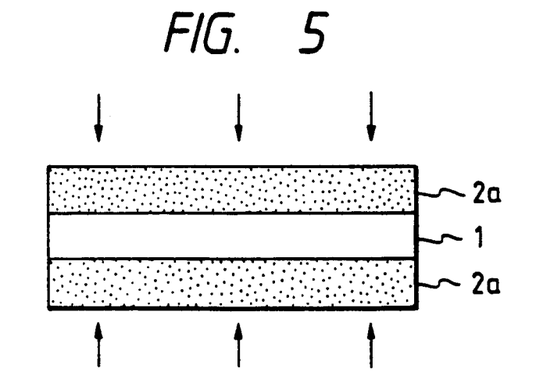

FIG. 5 is a cross section illustrating still another embodiment of the light-irradiation in the present invention. This embodiment is concerned with a method in which two sheets of the above light-transmissive substrate 2a are used and the organosilicon polymer 1 is held between them and light-irradiation is effected from both surfaces thereof. Employment of this embodiment makes it possible to prevent surface irregularities owing to the evaporation of the solvent contained in the polymer 1 to form a smoother film.

In the present invention, the substrate that can be used when the substrate and film are sintered together may be satisfactory if it is a heat-resistant substrate that can endure sintering up to the stage at which the organosilicon polymer has cured by sintering and its flatness has not been substantially lost. Acocrdingly, it is also possible to use as the heat-resistant substrate those which may disappear in the course of sintering.

However, it is preferred that the heat-resistant substrate may not disappear or deform, from the viewpoint of the flatness of the X-ray mask suppoqt film formed thereon, etc. Such a heat-resistant substrate may be satisfactory if it comprises a material stable to a high temperature of at least 1,400° C., preferably 1,500° C. or more. It may specifically include ceramics as exemplified by alumina and magnesium oxide, and graphite.

In instances in which materials like metal silicon are utilized as the substrate, the substrate can be removed from the support film by ion etching in a gaseous phase, or by dissolution acid or alkali after sintering.

On the other hand, the heat-resistant substrate that disappears in the course of the sintering may include substrates made of a resin or metal having thermal resistance up to about 300° to 400° C. Such disappearance of the heat-resistant substrate results from decomposition, melting etc. occurring at 500° to 600° C.

As the above resin, suitably usable are the so-called engineering plastics as exemplified by polyoxymethylene, polyethersulfon, polyether ether ketone and polybutylene terephthalate, and as the metal, suitably usable are tin, lead, zinc and aluminum.

It is also preferred from the viewpoint of the surface smoothness of the resulting support film that the root-mean-square roughness of the heat-resistant substrate has a precision of not more than 10 nm. Preparing the support film by using the above substrate makes it possible to obtain an X-ray mask support film having a surface roughness of not more than 10 nm r.m.s.

The surface roughness at this time may preferably be measured by a measurement method that employs a non-contact optical roughness meter and can measure the roughness without giving any stress at the time of measurement, and it may be measured, for example, with a digital optical linear profiler TOPO TM-2D (Wyko Corporation).

The surface roughness as defined in the present invention can be conveniently measured using the above surface roughness meter.

The sintering step in the process of the present invention comprises, when the film is prepared according to the film formation method using a solution and when polysilane is employed as the organosilicon polymer, heating first the film for a given time, raising the temperature to 500° to 600° C., maintaining this temperature for a given time, thereafter, further raising the temperature to 1,100° to 1,400° C., and maintaining this temperature for a given time or gradually raising the temperature from 1,100° C. up to about 1,400° C., thus making a film having SiC crystals in a sintered state.

When polysilazan is employed as the organosilicon polymer, the step comprises raising first the temperature to 500° C., and thereafter, raising it to from 1,000° to 1,200° C. to carry out two-stage sintering, or gradually raising the temperature from 1,000° to about 1,400° C.

Typical examples for the heating rate or heating retention time in the sintering are set out later in Examples, but sintering conditions may be appropriately selected so that the Young's modulus and thermal expansion coefficient previously described may be set at the intended values.

The sintering is carried out in an atmosphere of inert gas, but the sintering may be carried out using other gases if such sintering is carried out at a stage in which the formation of SiC as the X-ray mask support film may not substantially be hindered.

PROCESS (3)

Prepared first are structures of a support frame and a support film each having the same form. The structures may comprise sintered products made of SiC, SiN or carbon, or products obtained by sintering the organosilicon polymer at about several hundred degrees Celsius, or molded products having plasticity. The sintered products or the like can be prepared by employing the same methods as described in Processes (1) and (2).

Figure 6:
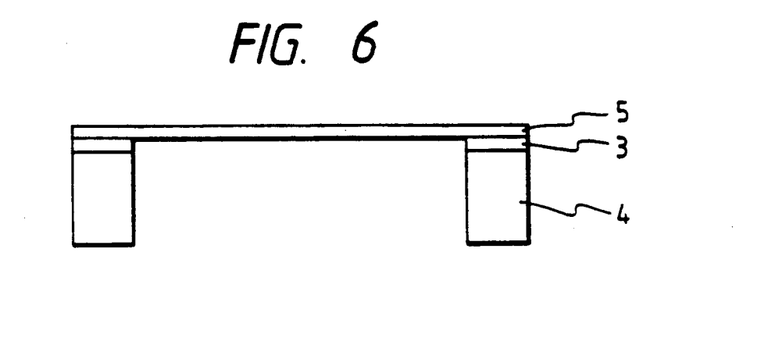
FIG. 6 is a view illustrating structures of a support frame and a support film which have the same form as each other and are fixed through an adhesive layer.

Next, on the structures of the support frame and support film each having the same form, a solution of the organosilicon polymer used in Process (2) is coated or a melt of the organosilicon polymer heated to a temperature higher than the melting point is coated, and thereafter, both structures (i.e., a support frame structure 4 and a support film structure 5) are fixed utilizing the adhesive force of an adhesive layer 3 comprising the organosilicon polymer or the like. To increase the adhesive force, a rougher adhering surface is preferred. Thereafter, sintering is carried out in the same manner as in Process (1), thus making an X-ray mask support.

For the solution or melt for use in provisionally adhering both the above structures, it is necessary to use the one that may form by sintering a sintered product having substantially the same composition as that of either the support frame or support film.

The X-ray mask support prepared in the above manner can be made free from the very cumbersome operation of particularly applying stress to the support film to fix it uniformly, because stress is necessarily applied to the support film owing to the contraction that takes place on sintering. This also makes it ready to prepare a homogeneous support film.

As described above, since no gaseous phase film formation may be utilized in the present invention, preparation conditions can be set relatively with ease, and mass production becomes possible. Also, since a high yield can be achieved, X-ray mask support films can be prepared at a low cost. It also has become possible to provide X-ray mask supports that may cause substantially no elongation of adhesives, deformation of frame members and sag or distortion of support films even by heat generated by X-ray irradiation or the like, and also can have a high mechanical strength.

Moreover, since the surface of the support film is so flat that preparing X-ray masks by using the same can bring about the effect such that;

(1) scattering of the visible light or infrared light for making alignment is small with high transmittance, resulting in improvement of the S/N ratio of the alignment light signal;
(2) non-uniformity in the strength of transmitting X-rays becomes very small; and
(3) precision in forming fine patterns and adhesion of the X-ray opaque or absorbing material are improved, resulting in almost no non-uniformity in thickness of the X-ray opaque or absorbing material.

The present invention will be described below in greater detail by giving specific Examples.

EXAMPLE 1

Polysilastyrene (trade name: S-400, available from NIPPON SODA CO., LTD.) was dissolved in toluene to prepare a 10 wt/v % solution. A surface-polished $Al_2O_3$ substrate having a surface roughness of 9 nm r.m.s. was set on a spinner (Mikasa Spinner 1H-2) and rotated at 400 rpm, on which the above solution was dropped, thus preparing a film of 31 μm thick.

Next, this film was placed in a sintering furnace together with the substrate, and, under dry nitrogen, heated at 200° C. for 1 hour and further raised up to 1,200° C. at a rate of 10° C./min. The furnace was maintained at this temperature for 1 hour, followed by cooling to obtain a silicon carbide film having a thickness of 2.9 μm and a surface roughness of 8 nm.

The silicon carbide film was cut into a strip of 10×50 $mm^2$, and its Young's modulus measured using a tensile tester was found to be 200 GPa. Thermal expansion coefficient was $7 \times 10^{-6} K^{-1}$.

The above polysilastyrene solution was coated by brushing on a silicon carbide support frame (having the shape of a ring of 75 mm in inner diameter, 90 mm in outer diameter and 5 mm in thickness) obtained by a reactive sintering process, and the above silicon carbide film was fixed thereon, followed by sintering under the same condition as above to obtain an X-ray mask support.

EXAMPLE 2

A silicon carbide support frame similar to the one used in Example 1 was placed on a carbon substrate, and a polysilastyrene solution in a concentration of 10 wt/v % was flowed thereon, followed by drying to form a polysilastyrene film.

This was sintered in the same manner as in Example 1. As a result, there was obtained an X-ray mask support comprising the support frame and a silicon carbide film fixed on the support frame.

EXAMPLE 3

The inside of a 1 liter autoclave made of glass was replaced with dry nitrogen, and charged therein was 0.4 g of KH (100 mmol; 3.9 mol % based on $CH_3SiHNH$).

Tetrahydrofuran (300 ml) was dropwise added with a syringe in flask having a three-way cock, and the mixture was stirred to disperse KH. Next, using a syringe filled with nitrogen, 15.271 g (0.258 mol) of $(CH_3SiHNH)_3$ was slowly added to the stirred KH slurry over a period of 15 minutes. After stirring at room temperature for 90 minutes, generation of gas stopped, and a transparent and homogeneous solution remained. Addition thereto of 2.28 g (16.1 mmol) of methyl iodide immediately resulted in formation of a white precipitate of KI. This reaction mixture was further stirred for 30 minutes. Next, most of the THF solution was removed under reduced pressure, and 80 ml of hexane was added to the remaining white slurry. The resulting mixture was subjected to centrifugal separation to separate supernatant liquid from a white solid. This solution was subjected to a trap-to-trap distillation, so that 15.1 g (99% by weight) of a white precipitate remained.

This was dissolved in toluene and spin-coated on a carbon substrate having a surface roughness of 10 nm.

Placed thereon was a silicon nitride ring having the same size as used in Example 1, which was heated in a sintering furnace to 1,300° C., and thereafter, the furnace was maintained at this temperature for 4 hours, followed by cooling to obtain an X-ray mask support having a support film of 2.2 μm in thickness and 9.5 nm in surface roughness.

EXAMPLE 4

Figure 7:
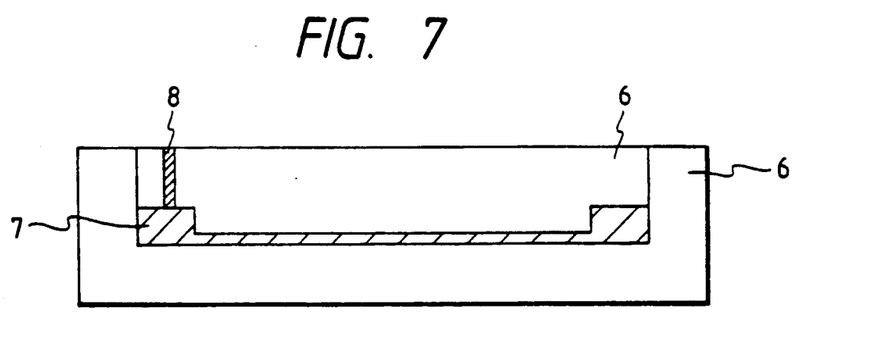
FIG. 7 is a view illustrating a process in Example 4.

A mold 6 as shown in FIG. 7 was placed on a heater, which was kept heated to 200° C., and a melt flow indexer was connected to a hole provided on the mold. Nozzle temperature was kept to 250° C., and polysilastyrene was introduced. A weight (22.125 g) was placed on the upper part and the polysilastyrene was flowed in the mold until it flowed out from another hole. Thereafter, this was subjected to press molding at 300° C. under a pressure of 150 kg/cm$^2$. After being cooled, the molded product was heated to 600° C. at a rate of 5° C./min and kept at this temperature for 1 hour. Thereafter, after being taken off from the mold, the product was again heated to 1,350° C. and kept at that temperature for 1 hour, followed by cooling. There was obtained an integral type mask support comprising silicon carbide.

EXAMPLE 5

X-Ray Mask Support Film (A)

Polysilastyrene (trade name: S-400, available from NIPPON SODA CO., LTD.) was dissolved in toluene to prepare a 10 wt/v % solution. A surface-polished carbon substrate (10 mm thick) having a surface roughness of 7.5 nm when measured with the surface roughness meter TOPO TM -2D previously described was set on a spinner (Mikasa Spinner 1H-2) and rotated at 500 rpm, on which the above solution was dropped, thus obtaining a film of 28 μm thick.

A carbon substrate polished similarly to the above was laid overlapping, and the film was laminated by pressing under a pressure of 10 kgf/cm$^2$ and at a temperature of 180° C. In a sintering furnace whose inside was replaced with dry nitrogen, the film was heated at 200° C. for 1 hour and then raised up to 1,350° C. at a rate of 10° C./min. The furnace was maintained in this state for 1 hour, followed by cooling.

The carbon substrate was taken off, and the surface roughness of the film was measured, which was found to be 9.0 nm. Film thickness was 2.6 μm and thermal expansion coefficient was $5 \times 10^{-5} K^{-1}$.

X-Ray Mask Support Film (B)

On a carbon substrate made ready for use in the same manner as in the support film (A), a toluene solution of 10 wt/v % polysilastyrene was spin-coated with a spinner. Revolution number was set to 400 rpm, and spin time to 30 seconds, thus obtaining a film of 3.2 μm thick. A carbon substrate finished similarly to the above substrate was laid overlapping, and the film was laminated in the same manner as in Example 1 by pressing under a pressure of 10 kgf/cm$^2$ and at a temperature of 180° C. In a sintering furnace whose inside was replaced with dry argon, the film was heated at 500° C. for 1 hour, and further raised up to 1,400° C. at a rate of 10° C./min. The furnace was maintained in this state for 2 hours, and then left to cool.

The carbon substrate was taken off, and then the surface roughness of the film was measured, which was found to be 8.0 nm. Film thickness was 2.9 μm and thermal expansion coefficient was $5 \times 10^{-5} K^{-1}$.

The film (A) and film (B) were adhered on a circular frame, made of e.g., stainless steel, having a larger thermal expansion coefficient (thermal expansion coefficient: $2 \times 10^{-5} K^{-1}$) than that of the films of the above (A) and (B), while applying tension. The film tension at this time was 70 MPa. On the film, an absorber (X-ray intercepting material) comprising gold was formed according to a usual mask preparation process. As a result, the lowering of yield because of defects such as peeling-off of the absorber was remarkably suppressed as compared with an instance in which the absorber comprising gold was formed similarly on an SiC film formed according to the CVD process commonly practiced and having a root-mean-square surface roughness of 50 nm. Also, the film was sagged upon X-ray irradiation in the case of a support in which a support frame (thermal expansion coefficient: $0.4 \times 10^{-6} K^{-1}$) made of quartz glass and having a smaller thermal expansion coefficient was used in place of the above support frame.

For evaluation of performances, Young's modulus of the above film was measured according to a static pressure balloon method. As a result, there was obtained a value of 200 GPa.

EXAMPLE 6

Polysilastyrene (trade name: S-400, available from NIPPON SODA CO., LTD.) was dissolved in toluene to prepare a 10 wt/v % solution. A surface-polished Al$_2$O$_3$ substrate having a surface roughness of 9 nm was set on a spinner (Mikasa Spinner 1H-2) and rotated at 1,000 rpm, on which the above solution was dropped, thus preparing a film of 31 μm thick.

Put thereon was a silicon carbide support frame (having the shape of a ring of 75 mm in inner diameter, 90 mm in outer diameter and 5 mm in thickness) obtained according to a reactive sintering process, and the film was heated in an atmosphere of nitrogen at 200° C. for 1 hour, and further raised up to 500° C. at a rate of 10° C./min. The film was kept in this state for 1 hour, and further heated up to 1,300° C. at a rate of 5° C./min, which was maintained for two hours, followed by cooling to obtain an X-ray mask support having a silicon carbide film of 2.9 μm in thickness and 8 nm in surface roughness.

EXAMPLE 7

An X-ray mask support film comprising a silicon carbide film was obtained in the same manner as in Example 6 except that a polyether ether ketone sheet was used as a substrate.

The resulting film showed the same properties as in Example 6, and there was seen no difference considered to be caused by the influence of the decomposition of substrate polymer.

EXAMPLE 8

X-Ray Mask Support Film (C)

On a silicon wafer (100) substrate of 0.5 mm in thickness and 2.0 nm in surface roughness, an SiC film was formed using a plasma CVD apparatus to have a thickness of 2.0 μm. Used as raw material gases were SiH$_4$ and CH$_4$, and the component ratio was kept at 1:10, pressure at 10 to 50 Torr, and substrate temperature at 800° C. Thus, a film having a surface roughness of 0.5 μm was obtained.

Next, this substrate was set on a spinner (Mikasa Spinner 1H-2), and a solution obtained by dissolving polysilastyrene (trade name: S-400, available from NIPPON SODA CO., LTD.) in toluene to give a concentration of 10 wt/v % was dropped on the spinner which was rotated at 1,000 rpm, thus obtaining a film of 7.2 μm thick.

Next, this film was placed in a sintering furnace in which Ar gas was flowed, and the temperature was raised from room temperature up to 650° C. at a rate of 10° C./hr, which was maintained for 40 hours. Thereafter, the furnace was allowed to cool to room temperature, and subsequently, the temperature was raised up to 1,000° C. at a rate of 100° C./hr, which was maintained for 30 hours. Thereafter, the furnace was allowed to cool.

Finally, the Si wafer was anisotropically etched from the back surface with use of an aqueous KOH solution, and removed.

In this manner, there was obtained an X-ray mask support film comprising a self-supporting SiC film of 3.2 μm thick. This has a surface roughness of 2.0 nm on the surface that had been in contact with the Si wafer and 8.0 nm on the opposite surface.

X-Ray Mask Support Film (D)

On a silicon wafer (100) substrate of 0.5 mm in thickness, 76 mm in diameter and 2.0 nm in surface roughness, an SiC film and a polysilastyrene film were formed in the same manner as in support film (C). They had a film thickness of 1.8 μm and 5.1 μm, respectively. The SiC film had a surface roughness of 11 nm. In a sintering furnace whose inside was replaced with dry nitrogen, the product was sintered at 700° C. for 30 hours and at 1,050° C. for 20 hours, followed by slow cooling to room temperature.

Next, the silicon wafer was anisotropically etched from the back surface with use of an aqueous KOH solution, and removed. Thus, there was obtained an X-ray mask support film.

The silicon carbide frame, the same as in Example 1 was provided on each of these films (C) and (D) in the same manner as in Example 1 to obtain X-ray mask supports. On each of these X-ray mask supports, an X-ray absorber made of gold was formed according to a usual mask preparation process. As a result, in each film, the defects such as peeling-off of the absorber was remarkably decreased as compared with an instance in which the absorber comprising gold was formed similarly on an SiC film formed only according to the CVD process commonly practiced and having a surface roughness of 0.4 μm. Accordingly, the lowering of yield was remarkably suppressed even when a large number of X-ray masks were prepared. Also, the transmittance of the visible light for alignment was improved by 10% or more.

EXAMPLE 9

Polysilastyrene (trade name: S-400, available from NIPPON SODA CO., LTD.) was dissolved in toluene to prepare a 10 wt/v % solution. A surface-polished $Al_2O_3$ substrate having a surface roughness of 9 nm was set on a spinner (Mikasa Spinner 1H-2) and rotated at 400 rpm, on which the above solution was dropped, thus preparing a film of 31 μm thick.

Subsequently, using a high-pressure mercury lamp (USH-250), light irradiation was carried out on the film for 20 minutes, which film was then immersed in a mixed solvent of water: methanol=1:1 for 1 hour to peel the polysilastyrene film from the substrate.

Next, the resulting polysilastyrene film was placed alone in a sintering furnace, and the temperature was raised from room temperature to 600° C. at the rate of 5° C./min. The furnace was maintained in this state for 1 hour, and thereafter, the temperature was raised up to 1,300° C. at the rate of 5° C./min. The furnace was maintained in this state for 1 hour, followed by cooling to obtain a silicon carbide film of 2.9 μm in thickness and 8 nm in surface roughness.

The silicon carbide film was cut into a strip of 10×50 $mm^2$, and its Young's modulus measured using a tensile tester was found to be 200 GPa.

EXAMPLE 10

A silicon carbide whisker (available from Tateho Chemical Industries, Ltd.) of from 0.5 to 1.5 μm in fineness and from 5 to 200 μm in length was wetted with ethanol, and laid up on a graphite sheet having a surface roughness of 11 nm, followed by pressing under a pressure of 10 $kg/cm^2$ to prepare a layup with a thickness of 2 μm. Subsequently, ethanol in the layup was evaporated, and the resulting layup was spray-coated with a viscous solution obtained by dissolving polysilastyrene (trade name: S-400, available from NIPPON SODA CO., LTD.) in toluene to give a concentration of 40% by weight, followed by evaporation of toluene.

Next, on the resulting film, a silicon carbide support frame (having the shape of a ring of 75 mm in inner diameter, 90 mm in outer diameter and 5 mm in thickness) was put and pressed under a pressure of 5 $kg/cm^2$, and then placed in a sintering furnace filled with dry nitrogen. Subsequently, the temperature inside the furnace was maintained at 200° C. for 1 hour, and then raised to 1,400° C. at a rate of 10° C./min. The furnace was maintained at this temperature for 1 hour, and then cooled to obtain an X-ray mask support having a silicon carbide support film of 2.1 μm in thickness and 9 nm in surface roughness.

The silicon carbide film in the X-ray mask support prepared in the above manner according to the process of the present invention was cut into a strip of 10×50 $mm^2$, and its Young's modulus was measured using a tensile tester. The Young's modulus was found to be 250 GPa, which was a value enough for the X-ray mask support film.

EXAMPLE 11

Inside of a 1 liter autoclave made of glass was replaced with dry nitrogen, and charged therein was 0.40 g of KH (100 mmol; 3.9 mol % based on $CH_3SiNHN$).

Tetrahydrofuran (300 ml) was dropwise added the use of a syringe to the inside of the above autoclave, and the mixture was stirred to disperse KH. Next, using a syringe filled with nitrogen, 15.271 g (0.258 mol) of $(CH_3SiHNH)_3$ was slowly added to the stirred KH slurry over a period of 15 minutes. After stirring at room temperature for 90 minutes, generation of gas stopped, and a transparent and homogeneous solution remained. Addition thereto of 2.28 (16.1 mmol) g of methyl iodide immediately resulted in the formation of a white precipitate of KI. This reaction mixture was further stirred for 30 minutes. Next, most of the THF was removed under reduced pressure, and 80 ml of hexane was added to the remaining white slurry. The resulting mixture was subjected to centrifugal separation to separate supernatant liquid from a white solid. This solution was subjected to trap-to-trap distillation, so that 15.1 g (99% by weight) of white powdery polymethylsilazane was obtained.

A silicon nitride whisker (trade name: SNW, available from Tateho Chemical Industries, Ltd.) of from 0.1 to 1.5 μm in fineness and from 5 to 200 μm in length was laid up in the same manner as in Example 10. Subsequently, the resulting layup was spray-coated in the same manner as in Example 10, with a solution obtained by dissolving in toluene 40% by weight of the polymethylsilazane synthesized as described above, thus obtaining a film.

Next, on the resulting film, a silicon carbide support frame having the shape as the frame of Example 10 was put and pressed under a pressure of 5 $kg/cm^2$, which was placed in a sintering furnace filled with dry nitrogen. Subsequently, the temperature inside the furnace was raised to 1,300° C. at a rate of 5° C./min. The furnace was maintained at this temperature for 4 hours, and then cooled to obtain an X-ray mask support having a silicon carbide support film of 2.9 μm in thickness and 8 nm in surface roughness.

Young's modulus of the silicon carbide film in the X-ray mask support prepared in the above manner according to the process of the present invention was measured in the same manner as in Example 10. The Young's modulus was found to be 220 GPa, which was a value sufficient for the X-ray mask support film.

EXAMPLE 12

An X-ray mask support was obtained in the same manner as in Example 10 except that silicon carbide particles having an average particle diameter of 0.45 μm (grade: DUA-1, available from Showa Denko KK) were used in place of the silicon carbide whisker.

A support film in the resulting support showed good properties like the support film obtained in Example 10.

EXAMPLE 13

An X-ray mask support was obtained in the same manner as in Example 11 except that silicon nitride particles having an average particle diameter of 0.2 μm (grade: SNE-10, available from Ube Industries, Ltd.) were used in place of the silicon nitride whisker.

A support film in the resulting support showed good properties like the support film obtained in Example 11.

REFERENCE EXAMPLE 1

Polysilastyrene (trade name: S-400, available from NIPPON SODA193 toluene to prepare a solution of 10 wt/v % in concentration. A surface-polished carbon substrate was set on a spinner (Mikasa Spinner 1H-2) and rotated at 400 rpm, on which the above solution was dropped, thus preparing a film of 31 μm thick.

Next, the resulting film was sintered in the same manner as in Example 10 to obtain an X-ray mask support film.

Young's modulus of the film was measured in the same manner as in Example 10. The Young's modulus was found to be 200 GPa, which is a value lower than that of the films obtained in Examples of the present invention.

Young's moduli of the support films in the X-ray mask supports prepared in the above Examples were 200 GPa to 250 GPa (in SiC) and 200 GPa to 220 GPa (in SiN); thermal expansion coefficients of the support films and support frames were $4 \times 10^{-6}$ to $1 \times 10^{-5} K^{-1}$ (in SiC) and $3 \times 10^{-6}$ to $1 \times 10^{-5} K^{-1}$ (in SiN); and thermal conductivities were 80 W/m·K (in the case of SiC) and 20 W/m·K (in the case of SiN).

What is claimed is:

1. An X-ray mask support comprising a support frame and a support film, wherein said support frame comprises the same compound as that of said support film, and said compound is selected from the group consisting of silicon carbide and silicon nitride, and both said support frame and said support film have a thermal expansion coefficient of not more than $1 \times 10^{-5} K^{-1}$.

2. The X-ray mask support of claim 1, wherein Young's modulus of said support film is uniform over the entire film.

3. The X-ray mask support of claim 1, wherein Young's modulus of said support film is not less than 10 GPa.

4. The X-ray mask support of claim 1, wherein said support film has a uniform film thickness over the entire film.

5. The X-ray mask support of claim 1, wherein said support film has a film thickness of from 1 to 5 μm.

6. The X-ray mask support of claim 1, wherein said support film has a film thickness of from 2 to 4 μm.

7. The X-ray mask support of claim 1, wherein said support film has a surface roughness at least on the mask surface, of not more than 10 nm r.m.s.

8. The X-ray mask support of claim 1, wherein said support frame and support film have a thermal conductivity of not less than 4 W/m·K.

9. An X-ray mask support comprising a support frame and a support film, wherein said support frame and said support film comprise a compound selected from the group consisting of silicon carbide and silicon nitride, and the thermal expansion coefficient of said support film does not exceed the thermal expansion coefficient of said support frame.

10. The X-ray mask support of claim 9, wherein said support frame and support film independently comprise a material selected from the group consisting of silicon carbide and silicon nitride.

11. The X-ray mask support of claim 9, wherein said support frame comprises the same material as that of the said support film, said material being selected from the group consisting of silicon carbide and silicon nitride.

12. The X-ray mask support of claim 9, wherein said support frame and support film have a thermal conductivity of not less than 4 W/m·K.

13. The X-ray mask support of claim 12, wherein both said support frame and support film have a thermal expansion coefficient of not more than $1 \times 10^{-5} K^{-1}$.

14. The X-ray mask support of claim 12, wherein Young's modulus of said support film is uniform over the entire film.

15. The X-ray mask support of claim 12, wherein Young's modulus of said support film is not less than 10 GPa.

16. The X-ray mask support of claim 12, wherein said support film has a uniform film thickness over the entire film.

17. The X-ray mask support of claim 12, wherein said support film has a film thickness of from 1 to 5 μm.

18. The X-ray mask support of claim 12, wherein said support film has a film thickness of from 2 to 4 μm.

19. The X-ray mask support of claim 12, wherein said support film has a surface roughness at least on the mask surface, of not more than 10 nm r.m.s.

20. An X-ray mask support comprising:
   a support frame; and
   a support film, wherein said support frame and said support film are integrally formed and comprise a compound selected from the group consisting of silicon carbide and silicon nitride.

21. An X-ray mask support of claim 20, wherein Young's modulus of said support film is uniform over the entire film.

22. An X-ray mask support of claim 20, wherein Young's modulus of said support film is not less than 10 GPa.

23. An X-ray mask support of claim 20, wherein said support film has a uniform film thickness over the entire film.

24. An X-ray mask support of claim 20, wherein said support film has a thickness of from 1 to 5 μm.

25. An X-ray mask support of claim 20, wherein said support film has a film thickness of from 2 to 4 μm.

26. An X-ray mask support of claim 20, wherein said support film has a surface roughness at least on the mask surface, of not more than 10 nm r.m.s.

27. An X-ray mask support of claim 20, wherein said support frame and support film have a thermal conductivity of not less than 4 W/m·K.

28. An X-ray mask comprising a support frame, a support film and an X-ray absorber formed on said support film, wherein said support frame comprises the same compound as that of said support film, and said compound is selected from the group consisting of silicon carbide and silicon nitride, and both said support frame and said support film have a thermal expansion coefficient of not more than $1 \times 10^{-5} K^{-1}$.

29. The X-ray mask of claim 28, wherein Young's modulus of said support film is uniform over the entire film.

30. The X-ray mask of claim 28, wherein Young's modulus of said support film is not less than 10 GPa.

31. The X-ray mask of claim 28, wherein said support film has a uniform film thickness over the entire film.

32. The X-ray mask of claim 28, wherein said support film has a film thickness of from 1 to 5 μm.

33. The X-ray mask of claim 28, wherein said support film has a film thickness of from 2 to 4 μm.

34. The X-ray mask of claim 28, wherein said suport film has a surface roughness, at least on the mask surface, of not more than 10 nm r.m.s.

35. The X-ray mask of claim 28, wherein said support frame and support film have a thermal conductivity of not less than 4 W/m·K.

36. An X-ray mask comprising a support frame, a support film and an X-ray absorber formed on said support film, wherein said support frame and said support film comprise a compound selected from the group consisting of silicon carbide and silicon nitride, and thermal expansion coefficient of said support film does not exceed the thermal expansion coefficient of said support frame.

37. The X-ray mask of claim 36, wherein both said support frame and support film have a thermal expansion coefficient of not more than $1 \times 10^{-5} K^{-1}$.

38. The X-ray mask of claim 36, wherein Young's modulus of said support film is uniform over the entire film.

39. The X-ray mask of claim 36, wherein Young's modulus of said support film is not less than 10 GPa.

40. The X-ray mask of claim 36, wherein said support film has a uniform film thickness over the entire film.

41. The X-ray mask of claim 36, wherein said support film has a film thickness of from 1 to 5 μm.

42. The X-ray mask of claim 36, wherein said support film has a film thickness of from 2 to 4 μm.

43. The X-ray mask of claim 36, wherein said support film has a surface roughness, at least on the mask surface, of not more than 10 nm r.m.s.

44. The X-ray mask of claim 36, wherein said support frame and support film have a thermal conductivity of not less than 4 W/m·K.

45. The X-ray mask of claim 36, wherein said support frame and support film independently comprise a material selected from the group consisting of silicon carbide and silicon nitride.

46. The X-ray mask of claim 36, wherein said support frame comprises the same material as that of said support film, said material being selected from the group consisting of silicon carbide and silicon nitride.

47. An X-ray mask comprising a support frame, a support film and an X-ray absorber formed on said support film, wherein said support frame and said support film are integrally formed and comprise a compound selected from the group consisting of silicon carbide and silicon nitride.

48. An X-ray mask of claim 47, wherein Young's modulus of said support film is uniform over the entire film.

49. An X-ray mask of claim 47, wherein Young's modulus of said support film is not less than 10 GPa.

50. An X-ray mask of claim 47, wherein said support film has a uniform film thickness over the entire film.

51. An X-ray mask of claim 47, wherein said suport film has a thickness of from 1 to 5 μm.

52. An X-ray mask of claim 47, wherein said support film has a film thickness of from 2 to 4 μm.

53. An X-ray mask of claim 47, wherein said support film has a surface roughness, at least on the mask surface, of not more than 10 nm r.m.s.

54. An X-ray mask of claim 47, wherein said support frame and support film have a thermal conductivity of not less than 4 W/m·K.

55. An X-ray lithography processing method comprising the steps of:

irradiating an X-ray mask with X-rays, wherein the X-ray mask includes a suport frame, a support film and an X-ray absorber formed on the support film, wherein the support frame comprises the same compound as that of the support film, and the compound is selected from the group consisting of silicon carbide and silicon nitride, and both the support frame and the support film have a thermal expansion coefficient of not more than $1 \times 10^{-5} K^{-1}$; and transferring patterns of the X-ray absorber to a wafer.

56. The X-ray lithography processing method of claim 55, wherein Young's modulus of the support film is uniform over the entire film.

57. The X-ray lithography processing method of claim 55, wherein Young's modulus of the support film is not less than 10 GPa.

58. The X-ray lithography processing method of claim 55, wherein the support film has a uniform film thickness over the entire film.

59. The X-ray lithography processing method of claim 55, wherein the support film has a film thickness of from 1 to 5 μm.

60. The X-ray lithography processing method of claim 55, wherein the support film has a film thickness of from 2 to 4 μm.

61. The X-ray lithography processing method of claim 55, wherein the support film has a surface roughness, at least on the mask surface, of not more than 10 nm r.m.s.

62. The X-ray lithography processing method of claim 55, wherein the support frame and support film have a thermal conductivity of not less than 4 W/m·K.

63. An X-ray lithography processing method comprising the steps of:

irradiating an X-ray mask with X-rays, wherein the X-ray mask includes a support frame, a support film and an X-ray absorber formed on the support film, wherein the support frame and the support film comprise a compound selected from the group consisting of silicon carbide and silicon nitride, and the thermal expansion coefficient of the support film does not exceed the thermal expansion coefficient of the support frame; and transferring patterns of the X-ray absorber to a wafer.

64. The X-ray lithography processing method of claim 63, wherein both the support frame and support film have a thermal expansion coefficient of not more than $1 \times 10^{-5} K^{-1}$.

65. The X-ray lithography processing method of claim 63, wherein Young's modulus of the support film is uniform over the entire film.

66. The X-ray lithography processing method of claim 63, wherein Young's modulus of the support film is not less than 10 GPa.

67. The X-ray lithography processing method of claim 63, wherein the support film has a uniform film thickness over the entire film.

68. The X-ray lithography processing method of claim 63, wherein the support film has a film thickness of from 1 to 5 μm.

69. The X-ray lithography processing method of claim 63, wherein the support film has a film thickness of from 2 to 4 μm.

70. The X-ray lithography processing method of claim 63, wherein the support film has a surface roughness, at least on the mask surface, of not more than 10 nm r.m.s.

71. The X-ray lithography processing method of claim 63, wherein the support frame and support film have a thermal conductivity of not less than 4 W/m.·K.

72. The X-ray lithography processing method of claim 63, wherein the support frame and support film independently comprise a material selected from the group consisting of silicon carbide and silicon nitride.

73. The X-ray lithography processing method of claim 63, wherein the support frame comprises the same material as that of support film, the material being selected from the group consisting of silicon carbide and silicon nitride.

74. An X-ray lithography processing method comprising the steps of:

irradiating an X-ray mask with X-rays, wherein the X-ray mask includes a support frame, a support film and an X-ray absorber formed on the support film, wherein the support frame and the support film are integrally formed and comprise a compound selected from the group consisting of silicon carbide and silicon nitride; and transferring patterns of the X-ray absorber to a wafer.

75. An X-ray lithography processing method of claim 74, wherein Young's modulus of the support film is uniform over the entire film.

76. An X-ray mask lithography processing method claim 74, wherein Young's modulus of the support film is not less than 10 GPa.

77. An X-ray lithography processing method of claim 74, wherein the support film has a uniform film thickness over the entire film.

78. An X-ray lithography processing method of claim 74, wherein the support film has a thickness of from 1 to 5 μm.

79. An X-ray lithography processing method of claim 74, wherein the support film has a film thickness of from 2 to 4 μm.

80. An X-ray lithography processing method pf claim 74, wherein the support film has a surface roughness, at least on the mask surface, of not more than 10 nm r.m.s.

81. An X-ray lithography processing method of claim 74, wherein the support frame and support film have a thermal conductivity of not less than 4 W/m·W.

* * * * *

UNITED STATES PATENT AND TRADEMARK OFFICE
CERTIFICATE OF CORRECTION

PATENT NO. : 5,101,420

DATED : March 31, 1992

INVENTOR(S) : Nobuo Kushibiki, et al.

It is certified that error appears in the above-identified patent and that said Letters Patent is hereby corrected as shown below:

On Title page, item [56]

UNDER U.S. PATENT DOCUMENTS

"4,604,292 8/1986 Evens et al." should read --4,604,292 8/1986 Evans et al.--;
"4,608,326 8/1986 Neubermans et al." should read --4,608,326 8/1986 Neukermans et al.--;
"4,780,382 10/1988 Stengle et al." should read --4,780,382 10/1988 Stengl et al.--; and
--4,855,197 8/1989 Zapha et al." should read --4,855,197 8/1989 Zapka et al.--.

IN THE ABSTRACT

Line 7, "flame" should read --frame--.

IN THE DISCLOSURE

COLUMN 1

Line 38, "a" should be deleted; and
Line 65, "a" should be deleted.

UNITED STATES PATENT AND TRADEMARK OFFICE
CERTIFICATE OF CORRECTION

PATENT NO. : 5,101,420

DATED : March 31, 1992

INVENTOR(S) : Nobuo Kushibiki, et al.

It is certified that error appears in the above-identified patent and that said Letters Patent is hereby corrected as shown below:

COLUMN 2

Line 18, "appear" should read --appears--; and
Line 68, "have both" should read --both have--.

COLUMN 3

Line 11, "have both" should read --both have--; and
Line 54, "1x10$^{-1}$" should read --1x10$^{-5}$K$^{-1}$--.

COLUMN 5

Line 40, "intergrally" should read --integrally--.

COLUMN 6

Line 13, "fomed" should read --formed--; and
Line 51, "10°" should read --10--.

COLUMN 7

Line 5, "there by" should read --thereby--.

UNITED STATES PATENT AND TRADEMARK OFFICE
CERTIFICATE OF CORRECTION

PATENT NO. : 5,101,420

DATED : March 31, 1992

INVENTOR(S) : Nobuo Kushibiki, et al.

It is certified that error appears in the above-identified patent and that said Letters Patent is hereby corrected as shown below:

COLUMN 8

Line 10, "mn" should read --nm--;
    Line 13, "ths" should read --this--;
    Line 43, "th" should read --the--;
    Line 47, "substrate," should read --substrate--;
    Line 62, "similary" should read --similarly--;
and
    Line 65, "irradiatd" should read --irradiated--.

COLUMN 9

Line 13, "can not" should read --cannot--;
    Line 18, "discribed" should read --described--;
    Line 57, "has" should read --has been--;
    Line 58, "Acocrdingly," should read
--Accordingly,--; and
    Line 63, "suppout" should read --support--.

COLUMN 10

Line 13, "polyethe" should read --polyether--;
and
    Line 28, "TOPO TM - 2D" should read
--TOPO$^{TM}$ - 2D--.

UNITED STATES PATENT AND TRADEMARK OFFICE
CERTIFICATE OF CORRECTION

PATENT NO. : 5,101,420

DATED : March 31, 1992

INVENTOR(S) : Nobuo Kushibiki, et al.

It is certified that error appears in the above-identified patent and that said Letters Patent is hereby corrected as shown below:

COLUMN 11

Line 40, "flat that" should read --flat,--.

COLUMN 13

Line 16, "TOPO TM - 2D" should read --TOPO$^{TM}$ - 2D--; and
    Line 66, "was" should be deleted.

COLUMN 15

Line 3, "has" should read --had--.

COLUMN 16

Line 27, "enough" should read --sufficient--;
    Line 31, "Inside" should read --The inside--; and
    Line 34, "added" should read --added with--.

COLUMN 17

Line 31, "SODA 193" should read --SODA CO., LTD.) was dissolved in--.

UNITED STATES PATENT AND TRADEMARK OFFICE
CERTIFICATE OF CORRECTION

PATENT NO. : 5,101,420

DATED : March 31, 1992

INVENTOR(S) : Nobuo Kushibiki, et al.

It is certified that error appears in the above-identified patent and that said Letters Patent is hereby corrected as shown below:

COLUMN 19

Line 26, "suport" should read --support--; and
Line 38, "thermal" should read --the thermal--.

COLUMN 20

Line 14, "suport" should read --support--; and
Line 27, "suport" should read --support--.

COLUMN 22

Line 29, "pf" should read --of--; and
Line 34, "4 W/m•W." should read --4W/m•K.--.

Signed and Sealed this

Third Day of August, 1993

Attest:

MICHAEL K. KIRK

Attesting Officer

Acting Commissioner of Patents and Trademarks